(12) United States Patent
Mamchik et al.

(10) Patent No.: US 12,487,277 B2
(45) Date of Patent: Dec. 2, 2025

(54) MICRO-CHANNEL HEATSINK WITH EMBEDDED HEATER AND DIAMOND HEAT SPREADER

(71) Applicant: Intel Corporation, Santa Clara, CA (US)

(72) Inventors: Alexander I. Mamchik, Hillsboro, OR (US); Jaime A. Sanchez, Beaverton, OR (US); Sachin Gupta, Sherwood, OR (US); Matthew C. Zeman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 666 days.

(21) Appl. No.: 17/689,703

(22) Filed: Mar. 8, 2022

(65) Prior Publication Data

US 2022/0196728 A1     Jun. 23, 2022

Related U.S. Application Data

(60) Provisional application No. 63/158,787, filed on Mar. 9, 2021.

(51) Int. Cl.
*G01R 31/28* (2006.01)

(52) U.S. Cl.
CPC ..... *G01R 31/2865* (2013.01); *G01R 31/2863* (2013.01); *G01R 31/2875* (2013.01); *G01R 31/2877* (2013.01); *G01R 31/2896* (2013.01)

(58) Field of Classification Search
CPC ............ G01R 31/2865; G01R 31/2863; G01R 31/2875; G01R 31/2877; G01R 31/2896
See application file for complete search history.

(56) References Cited

U.S. PATENT DOCUMENTS

2006/0240690 A9 * 10/2006 Mok ................. G01R 1/07342
                                                      439/81
2006/0278884 A1 * 12/2006 Chen ...................... H01L 24/27
                                                      257/99

(Continued)

OTHER PUBLICATIONS

Oasis Materials <https://oasismaterials.com/blog/products/heater-coolers/>, accessed Mar. 8, 2022.

(Continued)

*Primary Examiner* — Jermele M Hollington
*Assistant Examiner* — Zannatul Ferdous
(74) *Attorney, Agent, or Firm* — Essential Patents Group, LLP

(57) ABSTRACT

Disclosed herein is a high-performance thermal chuck for enhanced thermal management of high-power integrated circuit (IC) devices. The disclosed high-performance thermal chuck provides active heating and cooling for post-manufacture device testing. A high-performance heatsink comprises microfluidic channels in a high thermal conductivity silicon carbide (SiC) body for providing enhanced active cooling of an IC device. A refractory heating element is embedded between an integrated heat spreader comprising diamond and the heatsink for providing active heating. The integrated heat spreader is bonded to the heatsink. Closely matched coefficients of thermal expansion between the diamond heat spreader and the heatsink mitigate thermally-induced warpage.

20 Claims, 12 Drawing Sheets

(56) References Cited

U.S. PATENT DOCUMENTS

2012/0169363 A1* 7/2012 Mayfield ............ G01R 31/2867
                                                    324/750.08
2018/0196084 A1* 7/2018 Tustaniwskyj ..... G01R 31/2874
2019/0244848 A1* 8/2019 Willwerth ......... H01L 21/67103
2021/0223310 A1* 7/2021 Hegblom ............ H01S 5/18305

OTHER PUBLICATIONS

"Aluminum Nitride Ceramic Heaters", Durex Industries <https://durexindustries.com/aluminum-nitride-and-alumina-ceramic-heaters> accessed Mar. 8, 2022.
Corbin, Michael V., et al., "Diamond Microchannel Heat Sink Designs For High Heat Flux Thermal Control", 11th Annual AIAA/MDA Technology Conference, Jul. 29-Aug. 2, 2002, 13 pgs.

* cited by examiner

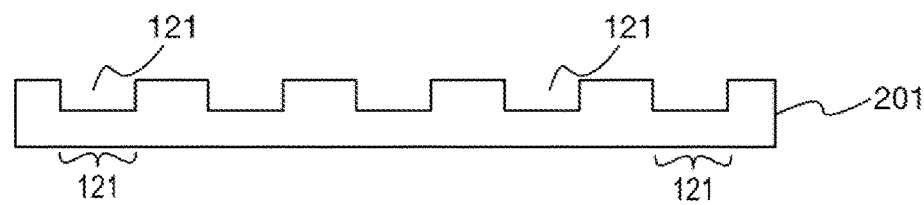
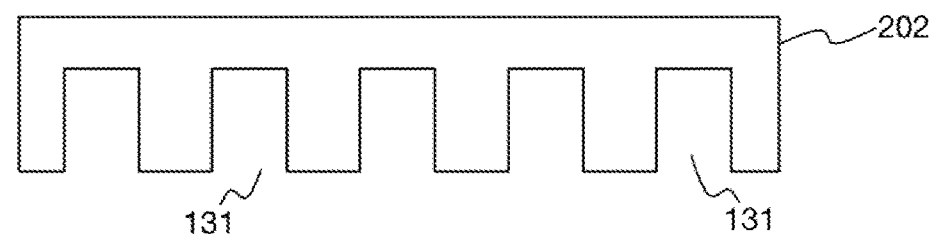
FIG. 2A
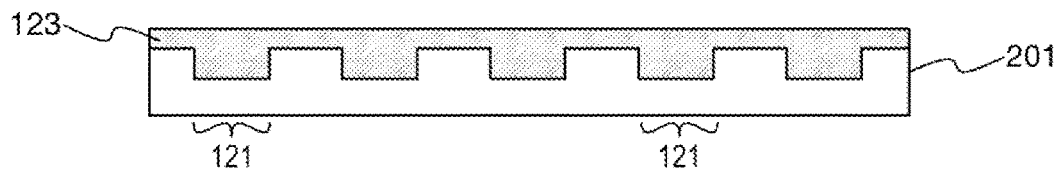
FIG. 2B
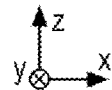

340
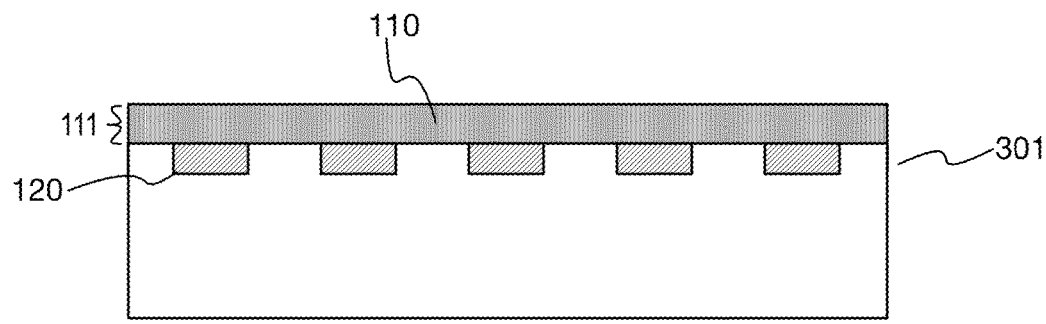
FIG. 3D
350
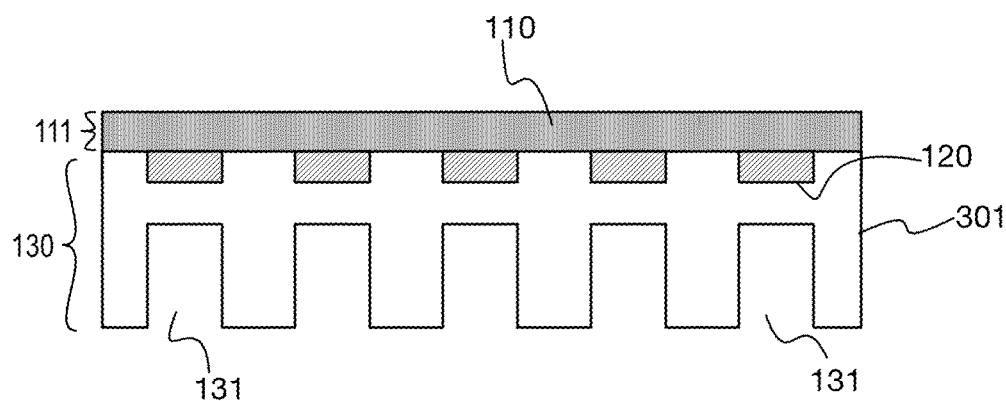
FIG. 3E
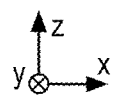

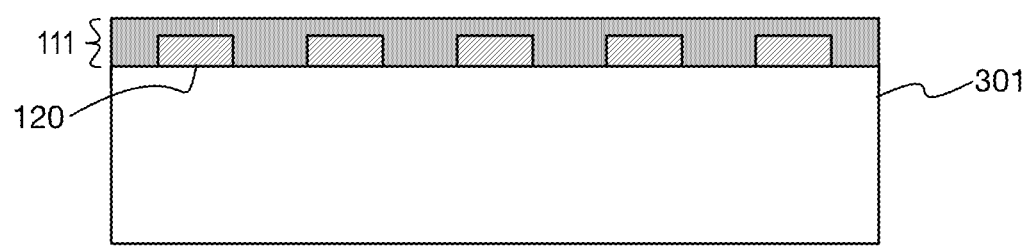
FIG. 4C
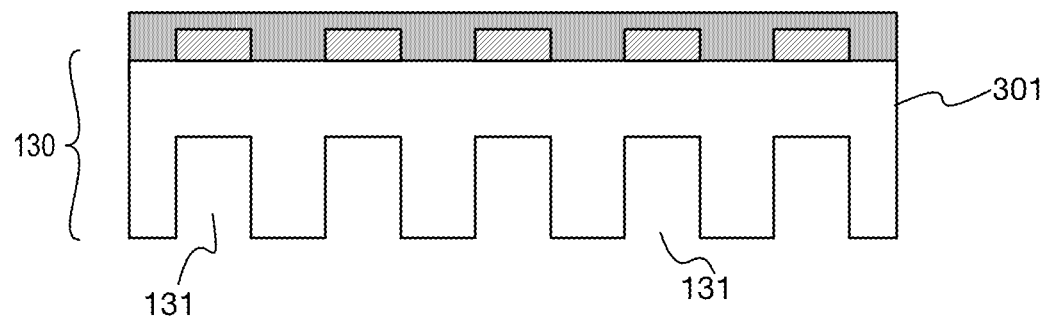
FIG. 4D
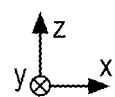

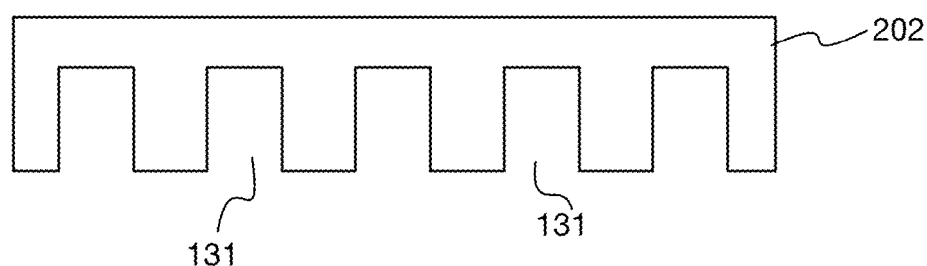
FIG. 5D
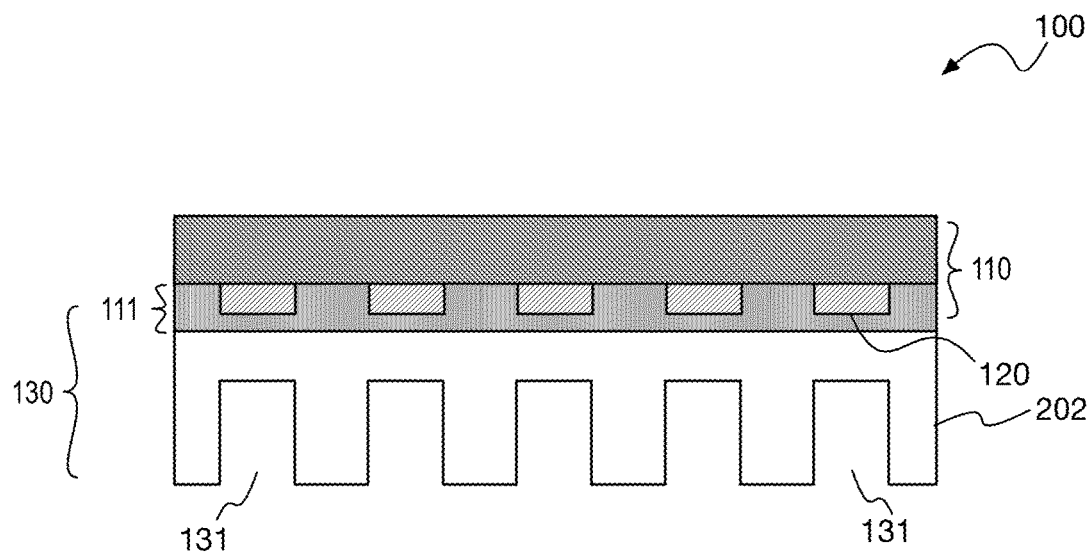
FIG. 5E
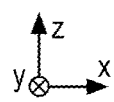

MICRO-CHANNEL HEATSINK WITH EMBEDDED HEATER AND DIAMOND HEAT SPREADER

CLAIM FOR PRIORITY

This application is a Non-Provisional of, and claims the benefit of priority to U.S. Provisional Patent Application No. 63/158,787, filed on Mar. 9, 2021, titled "MICROCHANNEL HEATSINK WITH EMBEDDED HEATER AND DIAMOND HEAT SPREADER", and which is incorporated by reference in its entirety for all purposes.

BACKGROUND

As transistors get smaller and operating frequencies of microprocessors increases, impact of within-chip device architecture on thermal management becomes increasingly important. During operation, a set of specific areas of the device dissipate most of applied power. Such uneven power distribution leads to a highly non-uniform temperature across the device and formation of hot spots whose temperatures are significantly higher than the surrounding regions. At high microprocessor workload, the temperature of the hot spots may exceed recommended operating temperature for semiconductor device, causing premature operation failures.

The impact of non-uniform power density is especially important for sort and test applications. In order to decrease test time, it is desirable to run all the test content with as high parallelism as possible. This requires high test power, which is often above and beyond the thermal design power of a device. Tests under these high test-power conditions push temperatures of hotspots to the limit in the device. As a result, effective control of the device temperature (i.e., reducing max temperature and smoothing on-device temperature gradient) during test becomes crucial and directly affects how much test content can be delivered and how quickly device test can be completed.

For device testing applications, it is also important to note that the running of some quality checks requires bringing a device (e.g., an IC die) under test to a pre-defined target temperature, hot or cold, and then maintaining at that temperature for duration of the test. Any time delay, when temperature changes and needs to stabilize, is an idle time of test and needs to be minimized to decrease overall test time. Moreover, any uncontrolled temperature change during the test can affect the test outcome and needs to be reduced as well. Thus, there is a need for a device that enables effective active thermal management for large gradient, high power-density integrated circuits. Such device should be capable of handling large heat fluxes, and at the same time be able to maintain device temperature by actively controlling heating and cooling.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

FIGS. 2A, 2B, 2C, 2D, and 2E illustrate exemplary structures as operations of an exemplary process flow for manufacturing a thermal chuck are performed;

FIGS. 3A, 3B, 3C, 3D, and 3E illustrate exemplary structures as operations of an exemplary process flow for manufacturing another thermal chuck are performed;

FIGS. 4A, 4B, 4C, and 4D illustrate exemplary structures as operations of an exemplary process flow for manufacturing another thermal chuck are performed;

FIGS. 5A, 5B, 5C, 5D, and 5E illustrate exemplary structures as operations of an exemplary process flow for manufacturing yet another thermal chuck are performed;

DETAILED DESCRIPTION

Figure 1:
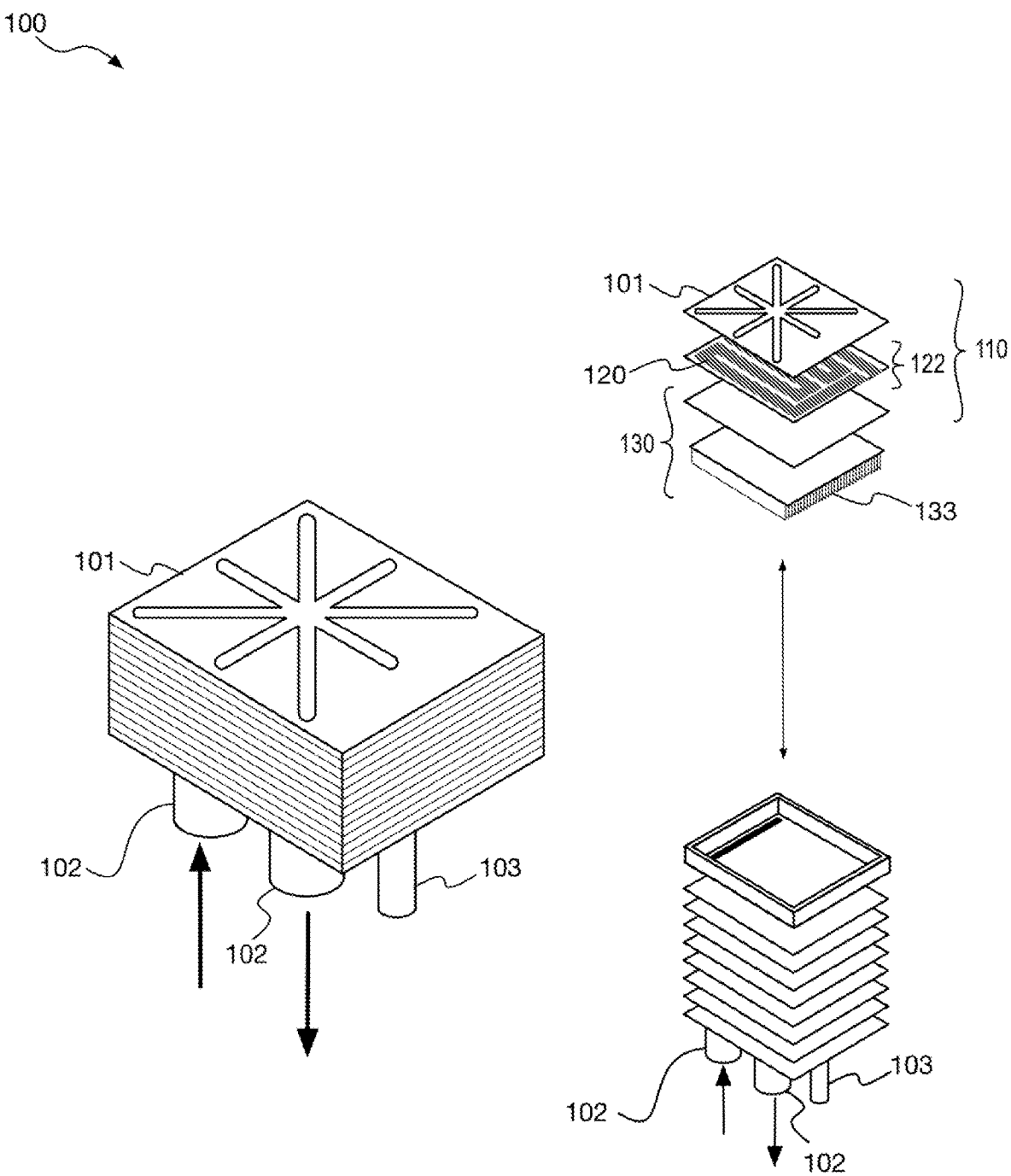
FIG. 1 illustrates both an exploded and assembled view of a representative thermal chuck.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over," "to," "between," and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "dielectric" generally refers to any number of non-electrically conductive materials. For purposes of this disclosure, dielectric material may be incorporated into an integrated circuit.

Here, the term "substrate" generally refers to a generally planar platform including dielectric or metal structures. The substrate mechanically supports, e.g., and may electrically couple to one or more integrated circuit dies, deposited films or other materials on a single platform, or the like.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, thermal, magnetic, or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top," "bottom," "above," and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). The term "pure" means not less than 99.9% by weight and "substantially pure" means not less than 99% by weight. The term "predominantly" means not less than 50% by weight. Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional," "profile," and "plan" correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Disclosed herein is a high-performance heatsink/thermal chuck that may address the concerns noted above. Also disclosed are methods for making the high-performance heatsink/thermal chuck. The disclosed device is a monolithic assembly comprising an integrated heat spreader, microfluidic channels, and an embedded heating element. The diamond integrated heat spreader exhibits a very high thermal conductivity k (e.g., where k is greater than 1000 W/(m·K); henceforth, hi-k) and a low coefficient of thermal expansion (CTE). The integrated heat spreader is bonded to a heat dissipation portion comprising a plurality of microfluidic channels within a silicon carbide (SiC) substrate. In some embodiments, the integrated heat spreader is grown on the SiC substrate. In some embodiments, the integrated heat spreader comprises polycrystalline diamond that is fusion bonded or brazed onto the SiC substrate. The monolithic heatsink (or "heat sink") assembly comprises materials having very high thermal conductivities and relatively low CTE (e.g., SiC and diamond) that generate only small thermomechanical mismatch between different materials.

In some embodiments, the microchannel heatsink assembly comprises a microfluidic channel array (henceforth microchannel array) formed within a silicon carbide (SiC) substrate. In some embodiments, the SiC substrate comprises monocrystalline (e.g., single crystal) SiC having a specific crystallographic orientation or a polycrystalline SiC-diamond composite. An etched microchannel array comprising a plurality of deep trenches is within the SiC substrate is adjacent to the integrated heat spreader. In some embodiments, an integrated electric heating element is embedded between the integrated heat spreader and the microchannel array. The thermal properties of SiC are particularly suitable for application within the disclosed microchannel heatsink assembly. For example, the thermal conductivity k1 of monocrystalline SiC is approximately 370 W/(m·K). The thermal conductivities of SiC-diamond composites are generally greater than 400 W/(m·K). The CTE of monocrystalline SiC is approximately $3\times10^{-6}$/K (or $3\times10^{-6}$ K$^{-1}$). Closely matched coefficients of thermal expansion between the diamond heat spreader and the SiC body mitigate thermally-induced warpage.

In implementations, the high-k integrated heat spreader may be in direct contact with a high power-consuming integrated circuit (IC) die, such as a high-performance processor or a radio frequency (RF) power amplifier. Such a high-power consuming die may incur non-uniform generation of heat in different portions of the IC die, where hot spots within the integrated circuitry may form due to localized heating by power-consuming circuitry at various locations on the die. The heat generation rate may be significantly higher than the rate of lateral heat transfer through the body of the die. The heat generated by underlying power-consuming circuitry may be effectively confined to the hotspot, causing an uneven temperature distribution on the die.

The high-k integrated heat spreader comprises polycrystalline diamond, having a thermal conductivity k2 of greater than 1000 W/(m·K). The high-k integrated heat spreader may laterally conduct and distribute the heat generated at the hotspots on the die more effectively than the die material (e.g., silicon). Lateral thermal gradients may be reduced within the die, enabling a reduction in hot spot temperatures and evening the lateral temperature distribution along the die.

In addition to lateral heat distribution, the integrated heat spreader also provides enhanced vertical heat transfer to the microchannels to provide a cooling function for the die. By virtue of the high thermal conductivity k1 of the SiC and SiC-diamond composites, the intervening hi-k monocrystalline (e.g., oriented single crystal) SiC or SiC-diamond composite material may provide enhanced heat transfer from the die to the microchannels. As an example, k1 may be over 400 W/(m·K). In implementations, thermal mismatch between the heat spreader and a silicon die may be minimized as diamond has a CTE of approximately $1 \times 10^{-6}$/K, whereas silicon has a CTE of approximately $3 \times 10^{-6}$/K. SiC has a CTE of approximately $4 \times 10^{-6}$/K. CTE mismatch between the diamond high-k integrated heat spreader and the SiC microchannel body may also be minimized.

In some embodiments, one or more heating elements are embedded between the integrated heat spreader and the microchannel array within the SiC substrate. The one or more heating elements may comprise, e.g., a refractory (or other) electrically conductive material such as, but not limited to, tungsten, nickel, chromium, molybdenum or doped graphite. The heating element may be a meandering filament extending through the diamond material of the integrated heat spreader or the SiC substrate. The heating element(s) may comprise an encapsulation comprising a dielectric coating to reduce electrical leakage from spreading into the host material (e.g., SiC).

A manufacturing process may include several embodiments. In some exemplary process flow embodiments, manufacture of the high-performance heatsink employs standard silicon carbide wafer substrates. In some exemplary process flow embodiments, manufacture of the high-performance heatsink employs two custom-thickness SiC wafer substrates. In some exemplary process flow embodiments, manufacture of the high-performance heatsink employs a single custom SiC wafer substrate. In some exemplary process flow embodiments, manufacture of the high-performance heatsink employs a custom SiC wafer and a polycrystalline diamond substrate. In some exemplary process flow embodiments, manufacture of the high-performance heatsink employs polycrystalline SiC-diamond composite substrates.

FIG. 1 illustrates both an exploded and assembled view of a representative thermal chuck 100, arranged in accordance with at least some implementations of the present disclosure. As shown in the exploded view, thermal chuck 100 comprises an integrated heater layer 122 comprising a heating element 120 (or heating trace or, simply, trace) on a substrate for active heating. Thermal chuck 100 also comprises a heatsink 130 below heater layer 122 comprising microchannels 133 for active cooling of a device under test (DUT) undergoing thermal cycling for diagnostic testing. In the illustrated embodiment, thermal chuck 100 comprises a heat spreader 110, further comprising vacuum platform 101 on which a DUT may be placed. A moderate vacuum may be actively applied to hold a DUT securely in place.

Fluid ports 102 and a vacuum port 103 are shown extending from the bottom of thermal chuck 100 in the assembled view. Fluid ports 102 may receive narrow bore tubing from a pump and reservoir system, allowing a coolant fluid such as water or water/glycol mixtures, silicone oil, HFE, other industrial coolants, etc., to circulate within microchannels 133. Gases such as air, argon or helium may also be employed as coolant fluids. In the assembled thermal chuck 100, the various layers are bonded together into a stack. All of the portions and functions of thermal chuck 100 are integrated into a monolithic body. Integrated heater layer 122 is embedded within the body of thermal chuck 100. Thermal chuck 100 comprises a high-thermal conductivity heat spreader 110, as shown in FIG. 1 and the subsequent figures of this disclosure and described below. In some instances, a fully assembled thermal chuck 100 (comprising heat spreader 110, heating element 120, and heatsink 130) will be referred to by its constituent part heatsink 130. In no case will a heatsink 130 (without heat spreader 110 or heating element 120) be referred to as a thermal chuck 100. In some embodiments, heating element 120 is below heat spreader 110. In some embodiments, heating element 120 is within heat spreader 110. In some embodiments, heat spreader 110 comprises a diamond substrate that heating element 120 is deposited on. In some embodiments, heat spreader 110 comprises a diamond layer that is formed onto heating element 120. In some embodiments, heatsink 130 comprises a diamond layer that bonds heatsink 130 to heat spreader 110.

Figure 2C:
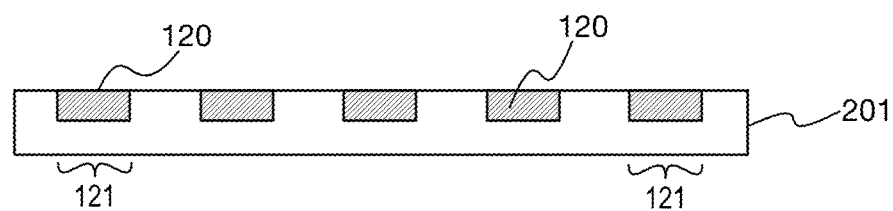
Figure 2D:
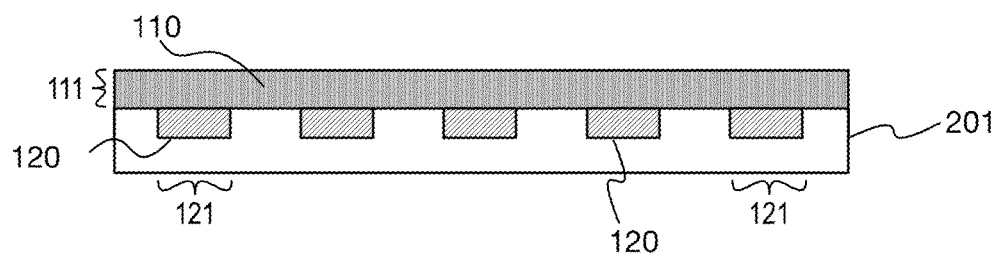
Figure 2E:
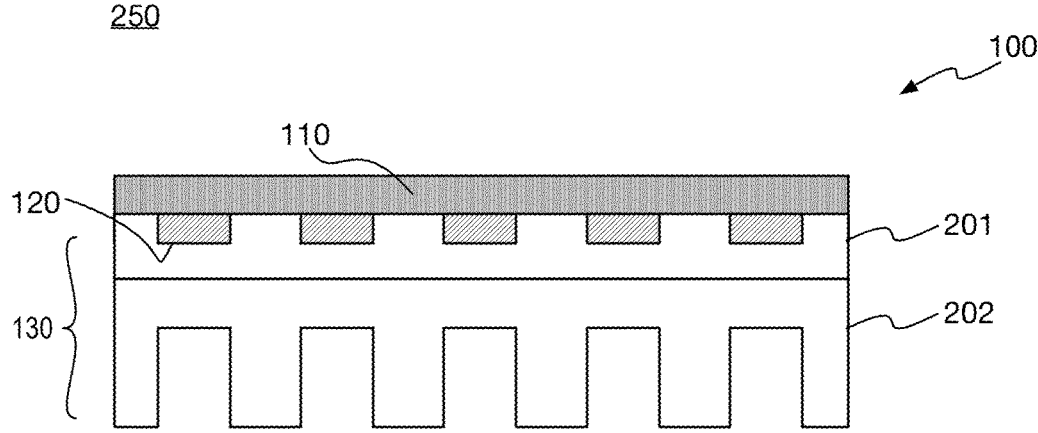

FIGS. 2A, 2B, 2C, 2D, and 2E illustrate exemplary structures as operations of an exemplary process flow for manufacturing a thermal chuck are performed, arranged in accordance with at least some implementations of the present disclosure. The process flow is illustrated in a sequence of wafer-level cross-sectional views. In the process flow described in FIG. 2, two wafer substrates are employed. In some embodiments, the substrates are two standard-thickness single-crystal SiC wafers. In some embodiments, the substrates are two polycrystalline SiC-diamond composite wafers. In some embodiments, the substrates are one of each type. In some embodiments, a polycrystalline diamond substrate is used for the first substrate, and a single-crystal SiC or polycrystalline SiC-diamond composite substrate is used for the second substrate. In a first operation 210 (as shown in FIG. 2A) of the process flow, deposition trenches 121 are etched on one side of a first wafer substrate 201 (from a wafer of diamond, single-crystal SiC, or polycrystalline SiC-diamond composite) to receive metallization for formation of an embedded heating element 120 (as shown in FIGS. 2C, 2D, and 2E). Deposition trenches 121 may be formed by lithographic patterning on one side of first wafer substrate 201 to form shallow deposition trenches 121. Laser machining may be used. A plasma etch method may be employed, such as through-mask dry reactive ion etching (DRIE) or a similar plasma etch such as inductively coupled plasma etching (ICPE), to form shallow deposition trenches 121 at the surface of first wafer substrate 201. Alternatively, a wet chemical etch may be employed. Wet chemical etch examples may comprise, for example, buffered hydrofluoric acid, phosphoric acid, or nitric acid. The etch may form shallow deposition trenches 121 (e.g., to a depth of 25?? microns) through a lithographically-defined etch mask. The deposition trench 121 (and, in FIGS. 2C, 2D, and 2E, heating element(s) 120) pattern may be a single continuous serpentine trace having multiple cross-wise segments that appear in the cross-sectional views of FIG. 2 as a plurality of separate deposition trenches 121 or heating element(s) 120. In alternate embodiments, heating element 120 comprises multiple heating elements 120.

In a parallel process line and a parallel operation 215 shown in FIG. 2A, a second wafer substrate 202 is similarly patterned on one side to form microchannel trenches 131. In some embodiments, second wafer substrate 202 may be thicker than first wafer substrate 201. The first and second wafer substrates 201, 202 may have thicknesses that are industry-standard thicknesses (e.g., 500 microns). In some embodiments, first or second wafer substrates 201, 202 are thicker than the industry standard. In some embodiments, first or second wafer substrates 201, 202 are 1000 microns thick. In some embodiments, first or second wafer substrates 201, 202 are 2000 microns thick. Microchannel trenches 131 formed within the second wafer substrate 202 may be etched to a greater depth and have a greater width than deposition trenches 121 etched in first wafer substrate 201. The set of microchannel trenches 131 may be employed as microfluidic channels (e.g., microchannels). Any of the etch processes mentioned above may be employed. The width and depth of the microchannel trenches 131 may be dimensioned to correspond to prescribed hydraulic diameters for accommodation of the hydrodynamic properties of specified cooling fluids (e.g., water, glycol, alcohols, gases). In some embodiments, microchannel trenches 131 have approximate depths and widths of 100 microns and 40 microns, respectively. In some embodiments, microchannel trenches 131 have approximate depths and widths of 150 microns and 30 microns. In some embodiments, microchannel trenches 131 have approximate depths and widths of 300 microns and 50 microns. In some embodiments, microchannel trenches 131 have approximate depths and widths of 600 microns and 80 microns. In some embodiments, microchannel trenches 131 have approximate depths and widths of 1000 microns and 50 microns.

In a second operation 220 of the process flow, as shown in FIG. 2B, a suitable metal is deposited over the first wafer substrate 201, filling deposition trenches 121. The metallization may include refractory or other metals such as, but not limited to, tungsten, tantalum, titanium, niobium, molybdenum, platinum, chromium and nickel. Alloys such as nickel-chromium may also be employed. Although the description will later refer to depositing and patterning metals, non-metals such as doped graphite may also be employed. Metals and non-metals may be deposited by processes including, but not limited to, DC and RF sputtering, evaporation, chemical vapor deposition (CVD) (e.g., plasma-enhanced CVD employing an organometallic precursor). In some embodiments, electro-plating is used.

As shown in FIG. 2B, the as-deposited metal may form a film 123 over portions of the wafer surface between deposition trenches 121 as well as filling the etched deposition trenches 121. In a third operation 230 of the process flow, as shown in FIG. 2C, the superficial metal film 123 has been removed to expose the surface of the first wafer substrate 201 outside of, and to leave heating element(s) 120 inside of, deposition trenches 121. As an example, a chemical-mechanical polish (CMP) operation may be employed to grind down the film 123 and remove excess metal outside of deposition trenches 121, planarizing the metal embedded within deposition trenches 121 with the surface of first wafer substrate 201.

In a fourth operation 240, as shown in FIG. 2D, a high-k integrated heat spreader 110 is formed by depositing a diamond layer 111 over the surface of the first wafer substrate 201, embedding the deposited metal of heating element 120 within deposition trenches 121. Diamond layer 111 may be deposited by a suitable method, such as but not limited to CVD processes. In some embodiments, diamond layer 111 may be grown to a thickness of 50 to 250 microns by the CVD process. Diamond layer 111 may be planarized to a target thickness by CMP. In some embodiments, heat spreader 110 may be formed by attaching a pre-formed diamond layer 111 over first wafer substrate 201, embedding the metal heating elements 120. As an example, a self-supporting diamond layer 111 may be grown on a substrate by a separate CVD process and removed to be attached to first wafer substrate 201.

In a fifth operation 250 of the process flow, as shown in FIG. 2E, the first and second wafer substrates 201, 202 may be bonded together by aligning their backsides and performing a bonding operation as shown, forming the thermal chuck 100. Diamond heat spreader 110 and heating element 120 are on one side of thermal chuck 100 and heatsink 130, comprising second wafer substrate 202, is on the other. In some embodiments, metal brazing may be employed to bond two wafer substrates 201, 202. A suitable brazing metal alloy may be employed to form the brazing joint between two wafer substrates 201, 202. In alternate embodiments, two wafer substrates 201, 202 may be bonded by fusion bonding or another thermocompression process. In the case of fusion bonding or similar bonding methods, no non-native material is within the bond line between two wafer substrates 201, 202. The bonded assembly may be diced to liberate individual thermal chuck 100/heatsink 130 devices.

Figure 3A:
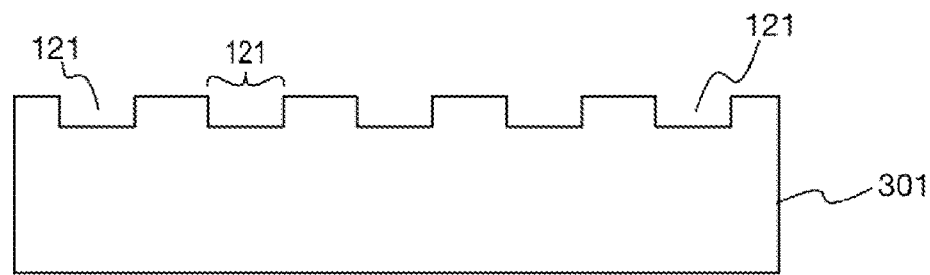
Figure 3B:
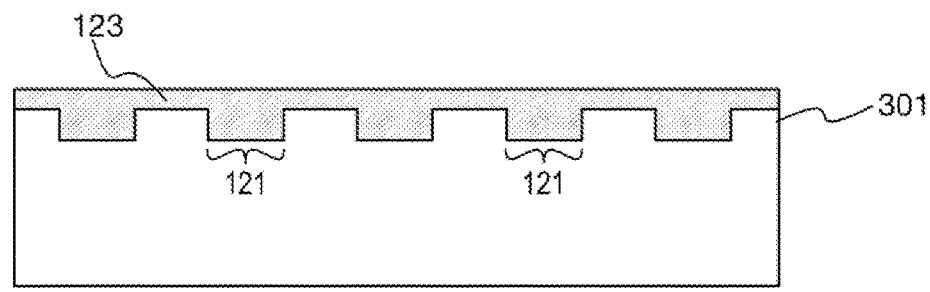
Figure 3C:
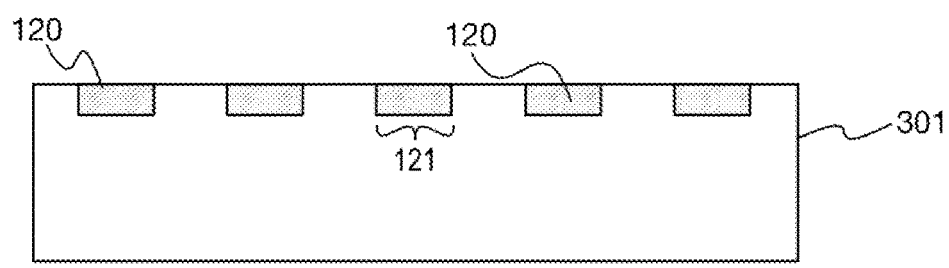

FIGS. 3A, 3B, 3C, 3D, and 3E illustrate exemplary structures as operations of an exemplary process flow for manufacturing another thermal chuck are performed, arranged in accordance with at least some implementations of the present disclosure. In a second example process flow, a single SiC wafer substrate 301 is employed. The SiC wafer substrate 301 may be a single-crystal SiC wafer or a polycrystalline SiC-diamond composite wafer. Again, the process is shown as a series of cross-sectional views. Operations are at wafer level. The single SiC wafer substrate 301 may have non-standard thickness that may be customized for etching microchannel trenches 131 to a target depth on one side of the wafer, and forming deposition trenches 121 for embedded heating element 120 (seen in FIGS. 3C, 3D, and 3E) on the opposing side of the wafer. In a first operation 310, as shown in FIG. 3A, shallow deposition trenches 121 are etched on one side of the SiC wafer substrate 301 to receive metallization for one or more heating elements 120. Suitable etching methods have been described above. A suitable metal is deposited into the etched deposition trenches 121 in the second operation 320, as shown in FIG. 3B, and may form a metal film 123 over wafer surface between deposition trenches 121. Suitable metals and deposition methods have been described above. In the third operation 330, as shown in FIG. 3C, the metal film 123 has been planarized (e.g., by CMP) and removed down to the surface of SiC wafer substrate 301, forming heating element(s) 120 in deposition trenches 121. In the fourth operation 340 of the process flow, as shown in FIG. 3D, integrated heat spreader 110 comprising CVD diamond layer 111 is grown over heating element(s) 120 and SiC wafer substrate 301, or attached as described above. The CVD diamond layer 111 may be polished to achieve a target thickness.

At this stage, as shown in FIG. 3E, SiC wafer substrate 301 is patterned and etched as described above to form microchannel trenches 131 and heatsink 130 on the side of SiC wafer substrate 301 opposing diamond layer 111 of integrated heat spreader 110 (e.g., the fifth operation 350 in FIG. 3E). While not shown in the process flow, a second wafer substrate may be bonded to SiC wafer substrate 301 to cap the microchannels. The wafer may be completed by formation of fluidic ports and electrical contacts (not shown) for heating element(s) 120. Finally, a dicing operation may be used to liberate individual thermal chuck 100/heatsinks 130 from SiC wafer substrate 301.

Figure 4A:
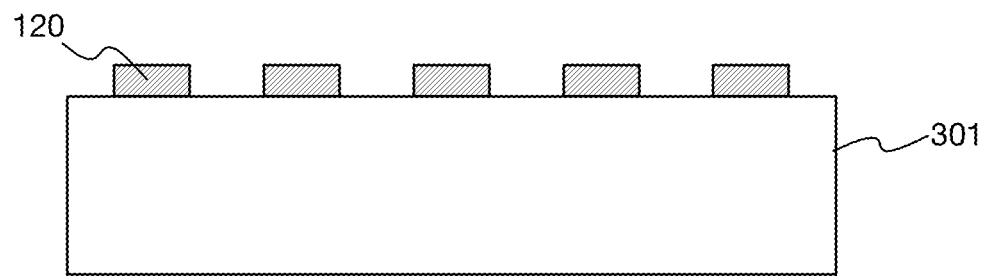
Figure 4B:
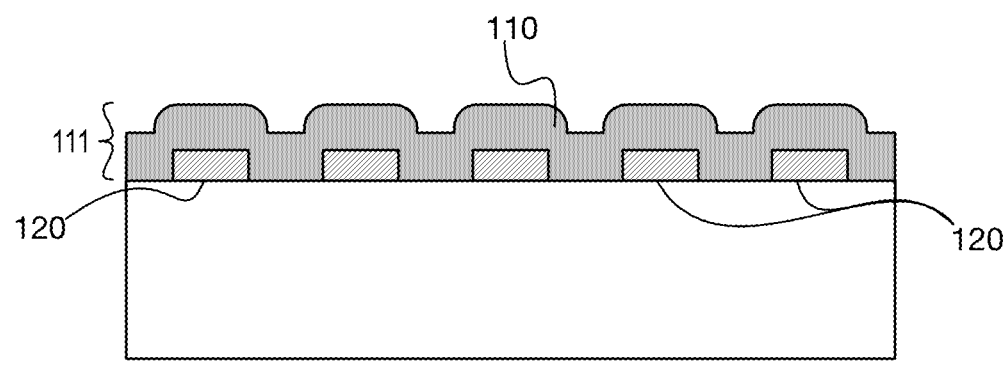

FIGS. 4A, 4B, 4C, and 4D illustrate exemplary structures as operations of an exemplary process flow for manufacturing another thermal chuck are performed, arranged in accordance with at least some implementations of the present disclosure. In FIG. 4, a third exemplary process flow is illustrated as a series of cross-sectional views. In a first operation 410, one or more heating elements 120 may be patterned on one side of a single SiC wafer substrate 301 (single crystal or SiC-diamond composite wafer) that may have a custom thickness. Trenches are not etched to receive the metal (or non-metal) for heating element(s) 120 in the process flow of FIG. 4. The metal for heating element(s) 120 may be deposited into openings formed within a lithographically-defined deposition mask. Metal structures for heating element(s) 120 are formed on the surface of SiC wafer substrate 301, as shown in FIG. 4A. In a second operation 420, diamond layer 111 is grown over the metal structures of heating element 120 to form integrated heat spreader 110. Diamond layer 111 may be grown by CVD methods, as described above.

In the third operation 430, as illustrated in FIG. 4C, diamond layer 111 is planarized (e.g., by CMP) to a target thickness over heating element 120 or SiC wafer substrate 301. Microchannel trenches 131 are etched on the opposing side of SiC wafer substrate 301 to form heatsink 130, as shown in the fourth operation 440, as illustrated in FIG. 4D. Microchannel trenches 131 may be etched to a suitable depth by methods described above. Finally, the SiC wafer substrate 301 may be diced to liberate individual thermal chuck 100/heatsinks 130.

Figure 5A:
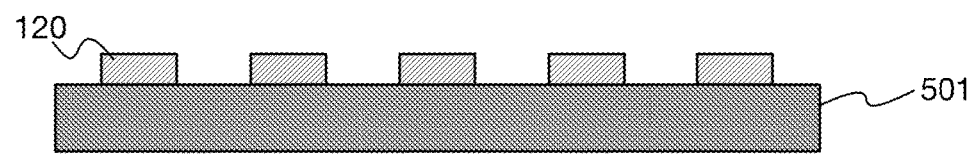
Figure 5B:
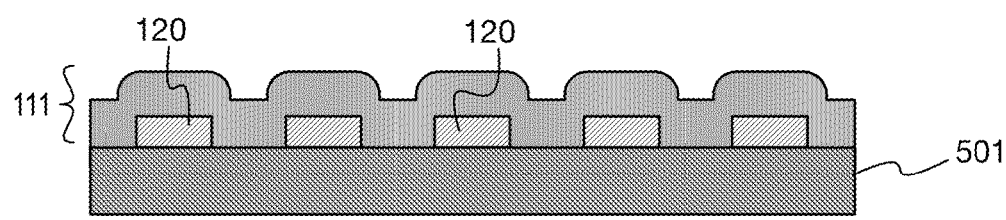
Figure 5C:
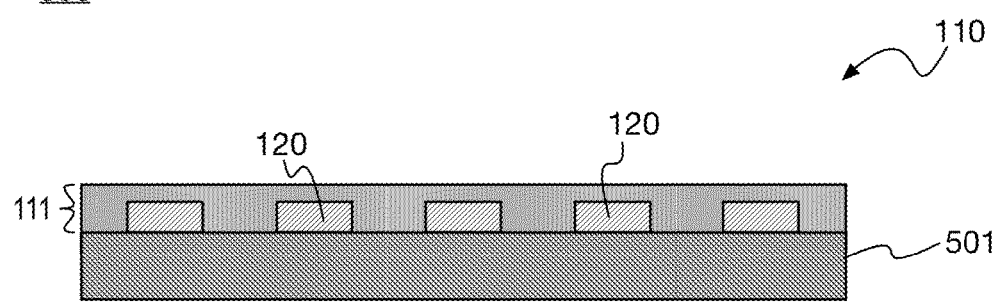

FIGS. 5A, 5B, 5C, 5D, and 5E illustrate exemplary structures as operations of an exemplary process flow for manufacturing yet another thermal chuck are performed, arranged in accordance with at least some implementations of the present disclosure. In FIG. 5, a fourth exemplary process flow is illustrated as cross-sectional views of each key operation. In the first operation 510, as illustrated in FIG. 5A, a diamond substrate 501 is metallized by a through-mask deposition processes. Diamond substrate 501 may comprise a self-supporting diamond sheet grown to desired thickness by a CVD process. One or more heating elements 120 are formed over diamond substrate 501 in a manner similar to first operation 410 of the process flow illustrated in FIG. 4A. In the second operation 520, as illustrated in FIG. 5B, diamond layer 111 is grown (e.g., by CVD) over the patterned heating element 120 and diamond substrate 501, and subsequently planarized to a target thickness in the third operation 530, as illustrated in FIG. 5C, forming a combination heating element 120 and high-k integrated heat spreader 110.

As shown in FIG. 5D and fourth operation 540, a SiC wafer substrate 202 (single crystal SiC wafer or polycrystalline SiC-diamond ceramic composite wafer) may be processed in parallel to form microchannel trenches 131 within SiC wafer substrate 202. SiC wafer substrate 202 may have a non-standard thickness. In some embodiments, SiC wafer substrate 202 is 1000 microns thick. In some embodiments, SiC wafer substrate 202 is 2000 microns thick. As described above, a plurality of deep microchannel trenches 131 may be etched by a suitable etch process (e.g., DRIE or ICPE). Microchannel trenches 131 may be etched to suitable dimensions to accommodate hydrodynamic diameter specifications, for example. In some embodiments, microchannel trenches 131 have approximate depths and widths of 200 microns and 50 microns, respectively. In some embodiments, microchannel trenches 131 have approximate depths and widths of 500 microns and 75 microns. In the final operation 550, as shown in FIG. 5E, SiC wafer substrate 202 may be bonded on its backside, opposite microchannel trenches 131, to diamond layer 111 grown on the CVD diamond substrate of the combination heating element 120/high-k integrated heat spreader 110, substantially completing thermal chuck 100/heatsink 130 assembly. In this way, diamond layer 111 can be thought of as part of integrated heat spreader 110 or a heatsink 130, also comprising SiC wafer substrate 202 (or both). Bonding may be achieved by a brazing process as described above. In some embodiments, a fusion bonding process may be employed to bond the grown diamond layer 111 to the SiC wafer substrate 202.

Subsequent wafer-level operations may include sealing the microchannels by bonding a second wafer over the open microchannels, and formation of fluidic ports and electrical contacts to the heating element(s) 120. The completed wafer assembly may be diced to liberate individual thermal chuck 100/heatsinks 130. In the illustrated embodiment, the high-k integrated heat spreader 110 comprises a CVD diamond substrate 501 (having a thickness ranging between 50 and 250 microns in some embodiments) bonded to the SiC substrate 202 through the grown diamond layer 111. As such, either or both heat spreader 110 and a heatsink 130 (comprising SiC substrate 202 with microchannel trenches 131) can comprise diamond layer 111. The heating element(s) 120 is/are embedded fully with the diamond matrix, and sandwiched between diamond substrate 501 and the grown diamond layer 111.

Figure 6:
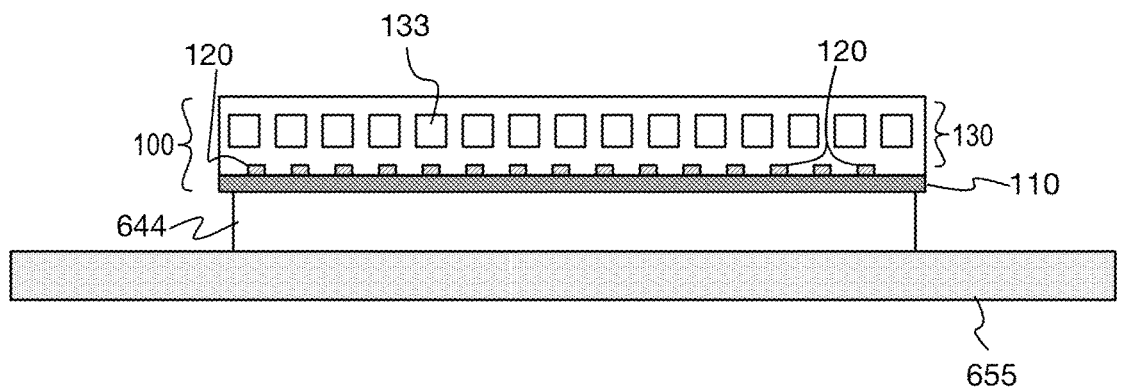
FIG. 6 illustrates a cross-sectional view of an exemplary implementation of the disclosed high-performance thermal chuck, including a high-performance heatsink, mounted over an integrated circuit package attached to a printed circuit board.
Figure 6:
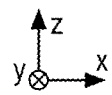

FIG. 6 illustrates a cross-sectional view of an exemplary implementation of the disclosed high-performance thermal chuck 100, including high-performance heatsink 130, mounted over an IC package 644 attached to a printed circuit board (PCB) 655, arranged in accordance with at least some implementations of the present disclosure. IC package 644 may comprise a high-performance microprocessor die, for example, that produces a large degree of heat when under high-power demand. For example, during high-speed computational bursts, a high-performance microprocessor may consume near 100 W of electrical power and dissipate a large portion of the power as heat. Hotspots may be additionally present where power-consuming integrated circuitry is located on the microprocessor die. The high-performance heatsink 130 may mitigate temperature excursions that otherwise would bring the device near or beyond its thermal design power, causing it to throttle back its speed or shut it down intermittently. In the illustrated implementation, high-k diamond integrated heat spreader 110 is in direct contact with IC package 644. Lateral thermal gradients may be reduced as a result of its very high thermal conductivity, alleviating thermal and thermomechanical stresses within IC package 644.

Enhanced heat dissipation from IC package 644 may be enabled by flowing a coolant fluid in microchannels 133 within the SiC body of high-performance heatsink 130. Fluid ports (not shown) on the heatsink 130 may be coupled to a pump and reservoir to circulate a coolant (e.g., water or water/glycol mixture) through microchannels 133. The width and z-height dimensions of microchannels 133 may be adjusted for equivalency to a specific hydraulic diameter dh (e.g., dh=4A/P, where A is the cross-sectional area of the channel and P is its perimeter) to meet hydrodynamic performance criteria of the coolant (e.g., based on flow rate, heat capacity and viscosity). An actively cooled fluid may enable establishment of a large vertical thermal gradient between the interface of IC package 644 with the integrated heat spreader 110 and the microchannels 133. Vertical heat flow from IC package 644 through the intervening thickness of diamond integrated heat spreader 110 and SiC material may be enhanced by the high thermal conductivities (noted above) of both materials. Rapid heat dissipation rates that may equal or exceed heat generation rates may be achieved by the combination of the high-k materials and the rapid convective heat transfer afforded by the microfluidic cooling. In some embodiments, cooling fins may be included for passive (or forced) convective heat dissipation from high-performance heatsink 130. In some embodiments, an embedded heating element 120 in high-performance heatsink 130 is included to warm the microprocessor to a base temperature in the event that the ambient temperature is too low for the microprocessor to function effectively (e.g., below −20° C.). Heating element 120 may be electrically coupled to an external temperature controller located on PCB 655 through electrical contacts (not shown) on the high-performance thermal chuck 100/heatsink 130. In some embodiments, high-performance thermal chuck 100/heatsink 130 comprises a temperature sensor such as a thermocouple or a resistance thermometer detector (RTD).

Figure 7:
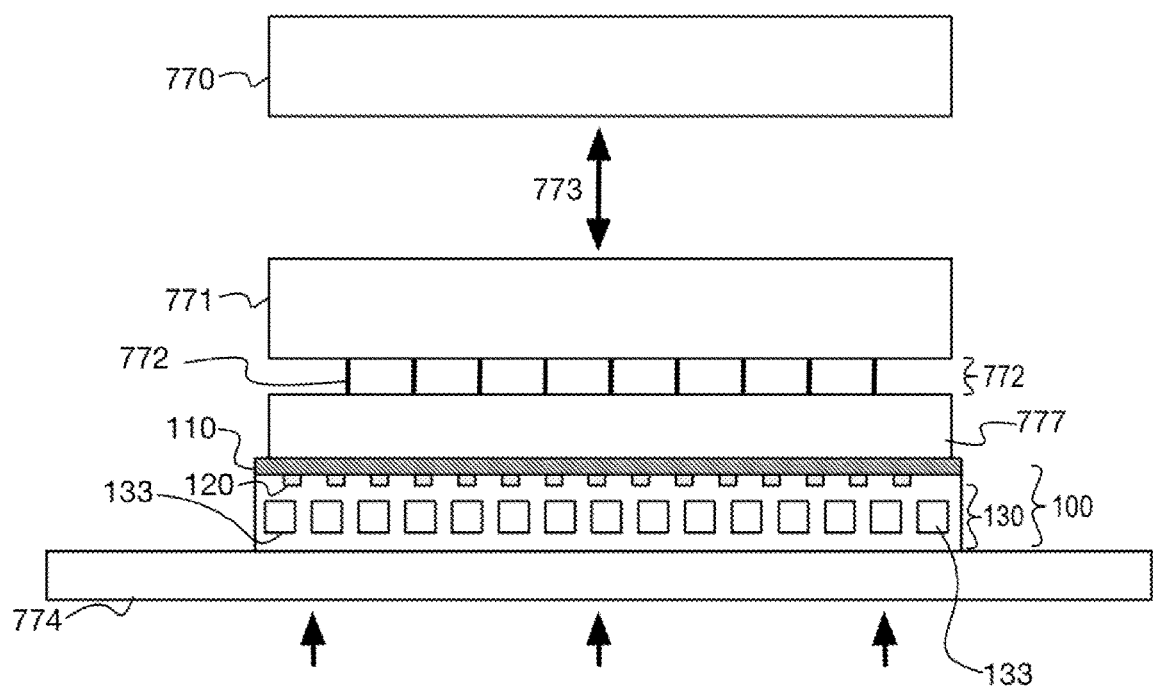
FIG. 7 illustrates a cross-sectional view of an exemplary implementation of a high-performance heatsink as part of a high-performance thermal chuck in a die test apparatus.

FIG. 7 illustrates a cross-sectional view of an exemplary implementation of high-performance heatsink 130 as part of high-performance thermal chuck 100 in a die test apparatus, arranged in accordance with at least some implementations of the present disclosure. The apparatus comprises an electrical tester (E-tester) 770 that is electronically coupled to a probe card 771. The E-tester may be automated to conduct a series of electrical and thermal stress tests for the die under test (DUT) 777. Probe card 771 provides a plurality of electrical contacts 772 for a pre-packaged die (e.g., DUT 777). A data stream 773 is shown to be passing to and from E-tester 770 and probe card 771. Data stream 773 can include, e.g., control signals, test stimuli, and test data. A stage 774 provides support for thermal chuck 100.

In the implementation illustrated in FIG. 7, disclosed high-performance heatsink 130 is employed in thermal chuck 100. Thermal chuck 100 provides and serves as an active heatsink 130 for DUT 777. DUT 777 is in direct contact with diamond heat spreader 110. In some embodiments, thermal chuck 100 and stage 774 may comprise a mechanism for holding DUT 777 securely against heat spreader 110 and aligning electrical contacts 772 on DUT 777 with pins on probe card 771. In FIG. 7, probe card 771 is shown to be lowered to contact DUT 777, and thermal chuck 100 and stage 774 are shown to be positioned up to contact probe card 771. Probe card 771 may apply pressure to DUT 777 for secure mechanical contact with thermal chuck 100.

Thermal chuck 100 comprises embedded heating element 120 that may be electrically connected through a separate cable (not shown) to a controller that is within E-tester 770. Simultaneously, fluid ports (not shown) on thermal chuck 100 may couple microchannels 133 to a pump and reservoir, whereby the pump circulates a cooling fluid (e.g., water or water/glycol mixture) through microchannels 133 for enabling thermal chuck 100 to carry out a cooling phase of a thermal cycling algorithm commanded by microprocessor within E-tester 770. In some embodiments, the cooling fluid may be a pressurized gas, such as air, argon or helium. In some embodiments, high-performance thermal chuck 100/heatsink 130 comprise a temperature sensor such as a thermocouple or a RTD electrically coupled to E-tester 770.

Figure 8:
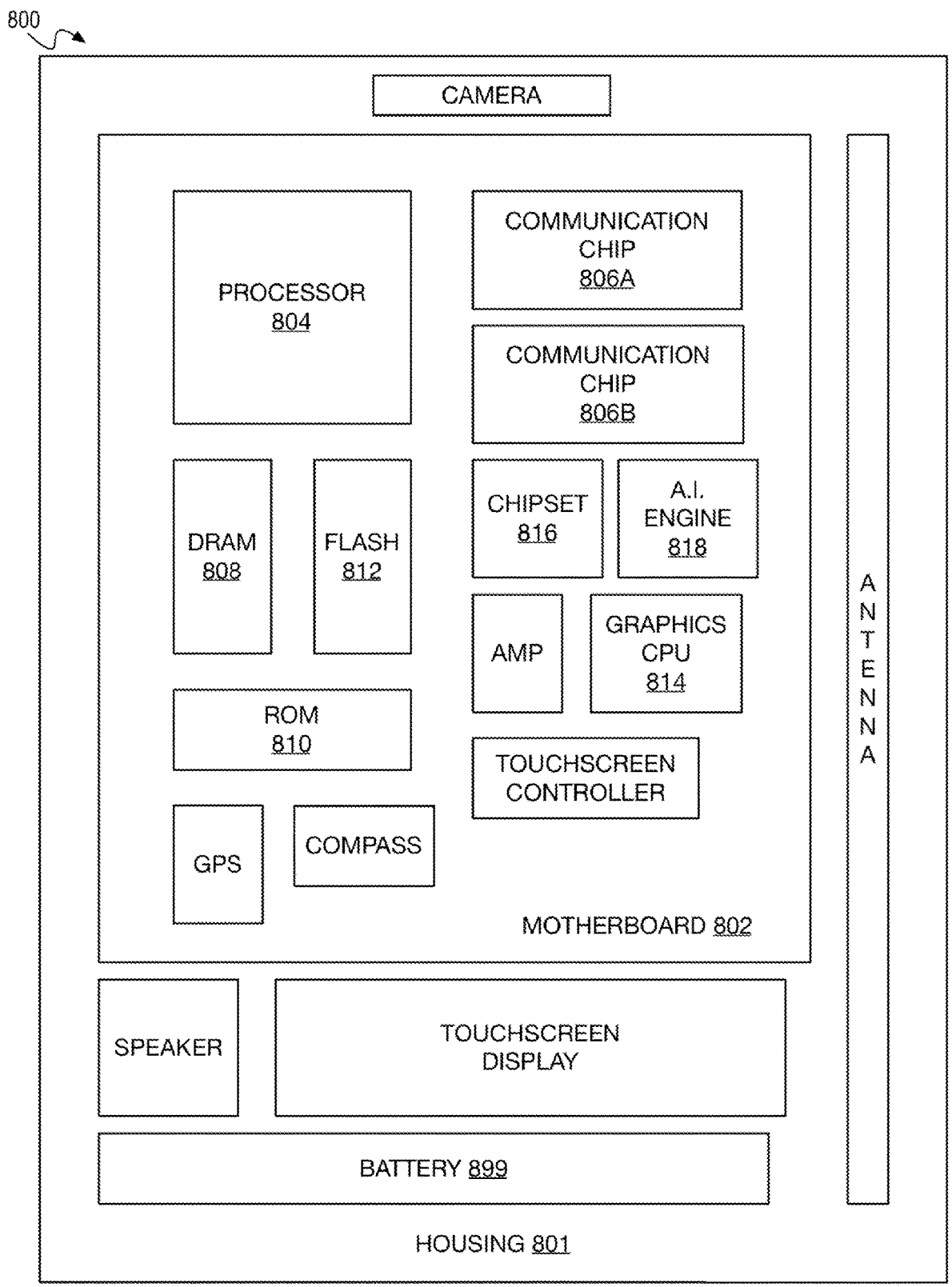
FIG. 8 illustrates an electronic system, specifically a computing device, all arranged in accordance with at least some implementations of the present disclosure.

FIG. 8 illustrates an electronic system, specifically a computing device 800, in accordance with at least some implementations of the present disclosure. Computing device 800 may include a housing 801 having a board 802 disposed therein. Computing device 800 may include a number of integrated circuit components, including but not limited to a processor 804, at least one communication chip 806A, 806B (including Network Devices or Processors), volatile memory 808 (e.g., DRAM), non-volatile memory 810 (e.g., ROM), flash memory 812, a graphics processor or CPU 814, a digital signal processor (not shown), a crypto processor (not shown), a chipset 816, an Artificial Intelligence (A.I.) Engine 818, an antenna, a display (touchscreen display), a touchscreen controller, a battery 899 (or other power supply), an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to board 802. In some implementations, at least one of the integrated circuit components may be a part of processor 804.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 800 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

The entire computing device 800 or at least one of the integrated circuit components within computing device 800 may be used for controlling one or more temperatures or test stimuli in FIGS. 6 and 7. In some embodiments, processor 804 controls the flow of cooling fluid through microchannels in a thermal chuck, e.g., by control signals to pumps or valves, or re receives temperature data from one or more temperature sensors, such as thermocouples or RTDs. In some embodiments, processor 804 controls the energization of embedded heating elements in a thermal chuck. In some embodiments, computing device 800 uses communication chips 806A and 806B to receive data (e.g., from temperature sensors) and transmit control signals (e.g., to heaters, pumps, and valves). In some embodiments, volatile memory 808, non-volatile memory 810, and flash memory 812 are used by computing device 800 for storing programming code and/or data (e.g., from temperature sensors). In some embodiments, computing device 800 is used in the processing of substrates, metals, and non-metals, as described in FIGS. 2-5 to manufacture the thermal chuck devices. In some embodiments, computing device 800 includes PLCs. In some embodiments, computing device 800 communicates or operates in parallel with PLCs. In some embodiments, computing device 800 includes FPGAs. In some embodiments, computing device 800 communicates or operates in parallel with FPGAs. In further implementations, computing device 800 may be any other electronic device that processes data.

It is understood that the subject matter of the present description is not necessarily limited to specific applications illustrated in FIGS. 1-8. The subject matter may be applied to other integrated circuit devices and assembly applications, as well as any appropriate electronic application, as will be understood to those skilled in the art.

The following examples pertain to further embodiments, and specifics in the examples may be used anywhere in one or more embodiments.

In one or more first embodiments, an apparatus comprises a first layer comprising predominantly diamond, the first layer having a substantially planar first surface to receive an integrated circuit device under test, an embedded heating element comprising metal in contact with or above at least a first portion of a second surface of the first layer opposite the first surface, and a heatsink comprising a crystalline material, the crystalline material comprising silicon and carbon, the heatsink comprising trenches distal from the substantially planar first surface of the first layer, wherein the heatsink is in contact with at least a second portion of the second surface.

In one or more second embodiments, further to the first embodiments, the embedded heating element is within the first layer, the first surface is above a top of the embedded heating element and the second surface is coplanar with a bottom of the embedded heating element, and the heating element is in contact with the heatsink.

In one or more third embodiments, further to the first or second embodiments, the embedded heating element is within the first layer, the first surface is above the top of the embedded heating element, and the second surface is below the bottom of the embedded heating element.

In one or more fourth embodiments, further to the first through third embodiments, the heatsink comprises silicon carbide.

In one or more fifth embodiments, further to the first through fourth embodiments, the heatsink comprises a composite of diamond and silicon carbide.

In one or more sixth embodiments, further to the first through fifth embodiments, the heatsink comprises an adhesion interface between first and second portions of the heatsink, the first portion comprising the first crystalline material and the second portion comprising the first crystalline material or a second crystalline material.

In one or more seventh embodiments, further to the first through sixth embodiments, the adhesion interface comprises a layer of a third material, the third material being a metal or an epoxy.

In one or more eighth embodiments, further to the first through seventh embodiments, the heatsink comprises diamond in contact with the second portion of the second surface and the embedded heating element.

In one or more ninth embodiments, further to the first through eighth embodiments, the first layer comprises substantially pure diamond.

In one or more tenth embodiments, further to the first through ninth embodiments, a probe card has contacts configured to electrically couple to the integrated circuit device under test.

In one or more eleventh embodiments, a system comprises a probe card, comprising contacts configured to electrically couple to an integrated circuit die under test, a stage, and a thermal chuck coupled to the stage, the thermal chuck comprising a first layer comprising predominantly diamond, the first layer having a substantially planar first surface to receive an integrated circuit die under test, an embedded heating element below the first surface of the first layer and within or immediately below the first layer, and a plurality of channels below the heating element, the plurality of channels being configured to carry a cooling fluid and being formed in spaces within a body comprising a crystalline material, the crystalline material comprising silicon and carbon and the body being in contact with the first layer.

In one or more twelfth embodiments, further to the eleventh embodiments, the crystalline material comprises silicon carbide.

In one or more thirteenth embodiments, further to the eleventh or twelfth embodiments, the crystalline material comprises diamond silicon carbide composite.

In one or more fourteenth embodiments, further to the eleventh through thirteenth embodiments, the first layer comprises substantially pure diamond.

In one or more fifteenth embodiments, further to the eleventh through fourteenth embodiments, the body comprises diamond in contact with the first layer and the embedded heating element.

In one or more sixteenth embodiments, a method comprises forming a heating element on a substrate comprising a first crystalline material, the first crystalline material comprising predominantly diamond or both silicon and carbon, the substrate having a first surface and a second surface, and the heating element having a third surface substantially coplanar with the first surface, forming a first layer on the heating element and the first surface, the first layer comprising predominantly diamond, planarizing a fourth surface of the first layer distal from the heating element, and providing a heatsink comprising a second crystalline material, the crystalline material comprising silicon and carbon, the heatsink comprising a first plurality of trenches distal from the fourth surface, and the heatsink in contact with at least a portion of the first layer.

In one or more seventeenth embodiments, further to the sixteenth embodiments, the forming a heating element on a substrate further comprises forming a second plurality of trenches in the first surface, the trenches configured to receive deposited metal in the form of the heating element, and forming a substantially planar first surface of the substrate comprising a first portion of the substrate and a first portion of the deposited metal by removing a second portion of the substrate and a second portion of the deposited metal or at least a second portion of the deposited metal.

In one or more eighteenth embodiments, further to the sixteenth or seventeenth embodiments, the providing a heatsink further comprises forming the first plurality of trenches in a fifth surface of a second substrate, the first plurality of trenches configured to channel fluid therebetween, and joining the second surface to a sixth surface of the second substrate distal from the first plurality of trenches.

In one or more nineteenth embodiments, further to the sixteenth through eighteenth embodiments, the first crystalline material comprises silicon and carbon.

In one or more twentieth embodiments, further to the sixteenth through nineteenth embodiments, the first crystalline material comprises predominantly diamond.

In one or more twenty-first embodiments, further to the sixteenth through twentieth embodiments, the providing a heatsink further comprises forming the first plurality of trenches in a fifth surface of a second substrate, the first plurality of trenches configured to channel fluid therebetween, and joining the fourth surface to a sixth surface of the second substrate distal from the first plurality of trenches.

In one or more twenty-second embodiments, further to the sixteenth through twenty-first embodiments, the first crystalline material comprises predominantly diamond.

Having thus described in detail embodiments of the present disclosure, it is understood that the appended claims are not to be limited by particular details set forth in the above description, as many apparent variations thereof are possible without departing from the spirit or scope thereof.

We claim:

1. An apparatus to support an integrated circuit device under electrical test (ICDUT), the apparatus comprising:
    a first layer comprising predominantly diamond, the first layer having a first surface to support the ICDUT;
    a heatsink to support the first layer and comprising a crystalline material, the crystalline material comprising silicon and carbon, the heatsink comprising a first trench within the crystalline material to convey a fluid through the heatsink; and
    an electrical heating element trace located between the first surface and the first trench and following a route over an area of the heatsink to be electrically heated by the trace, wherein the trace is over the crystalline material with a sidewall of the trace encapsulated by the first layer or is within a second trench in the crystalline material, the second trench following the route.

2. The apparatus of claim 1, wherein the heating element trace is embedded exclusively within the first layer with the first surface above the heating element trace and wherein a bottom of the heating element trace is either in contact with the crystalline material or in contact with an intervening material layer between the crystalline material and the first layer.

3. The apparatus of claim 2, wherein the heating element trace is spaced apart from the crystalline material by the intervening material layer, and wherein the intervening material layer comprises metal or an epoxy.

4. The apparatus of claim 1, wherein the crystalline material is silicon carbide.

5. The apparatus of claim 1, wherein the crystalline material comprises a composite of diamond and silicon carbide.

6. The apparatus of claim 1, wherein the heating element trace comprises tungsten, tantalum, titanium, niobium, molybdenum, platinum, chromium, nickel or graphite.

7. The apparatus of claim 1, wherein the heating element trace is within the second trench and a top of the heating element trace is coplanar with a top of the second trench.

8. The apparatus of claim 7, wherein the first layer is in direct contact with a top of the heating element trace.

9. The apparatus of claim 1, wherein the first layer is substantially pure diamond.

10. The apparatus of claim 1, further comprising fluid ports coupled to opposite ends of the first trench.

11. A system, comprising:
    a probe card, comprising contacts configured to electrically couple to an integrated circuit die under electrical test (ICDUT);
    a stage; and
    a thermal chuck coupled to the stage and to support the ICDUT, the thermal chuck comprising:
        a heatsink comprising a crystalline material further comprising silicon and carbon, the heatsink having a first trench within the crystalline material to convey a cooling fluid through the heatsink;
        a heat spreader over the crystalline material, the heat spreader comprising a layer of predominantly diamond and having a substantially planar first surface to support the integrated circuit die under test; and
        an electrical heating element trace below the first surface and following a route either within the layer of predominantly diamond or within one or more second trenches in the crystalline material of the heatsink.

12. The system of claim 11, wherein the crystalline material is silicon carbide.

13. The system of claim 11, wherein the crystalline material comprises diamond silicon carbide composite.

14. The system of claim 11, wherein the layer of predominantly diamond is substantially pure diamond, is in direct contact with the crystalline material, and is in direct contact with the electrical heating element trace.

15. The system of claim 11, wherein the crystalline material comprises diamond in contact with the electrical heating element trace.

16. A method of forming a thermal chuck for an integrated circuit device during electrical test (ICDUT), the method comprising:
    forming an electrical heating element trace on a substrate comprising a first crystalline material, the first crystalline material comprising predominantly diamond or both silicon and carbon;
    forming a first layer on the heating element trace and the first surface, the first layer to support the ICDUT and comprising predominantly diamond and;
    planarizing a top surface of the first layer; and
    attaching the top surface of the first layer to a heatsink comprising a second crystalline material, the second crystalline material comprising silicon and carbon, the heatsink comprising one or more first trenches.

17. The method of claim 16, wherein forming the electrical heating element trace further comprises:
    forming one or more second trenches in the substrate,
    depositing a material in the second trenches; and
    planarizing a top of the material within the second trenches with a top of the first crystalline material.

18. The method of claim 17, further comprising:
    forming the first trenches in a second substrate, the first trenches to channel fluid; and
    joining the second substrate to the substrate to enclose the first trenches.

19. The method of claim 18, wherein the first crystalline material comprises silicon and carbon.

20. The method of claim 18, wherein the first crystalline material comprises predominantly diamond.

* * * * *